US012400972B2

(12) United States Patent
Tanioka et al.

(10) Patent No.: US 12,400,972 B2
(45) Date of Patent: Aug. 26, 2025

(54) SEMICONDUCTOR DEVICE FOR SUPPRESSING EXCESSIVE WETTING AND SPREADING OF BONDING LAYER

(71) Applicant: ROHM CO., LTD., Kyoto (JP)

(72) Inventors: Tomonori Tanioka, Kyoto (JP); Kazuo Egami, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 414 days.

(21) Appl. No.: 17/843,319

(22) Filed: Jun. 17, 2022

(65) Prior Publication Data

US 2023/0005845 A1 Jan. 5, 2023

(30) Foreign Application Priority Data

Jul. 1, 2021 (JP) ................................ 2021-109982

(51) Int. Cl.

*H01L 23/00* (2006.01)
*H01L 23/31* (2006.01)
*H01L 23/495* (2006.01)

(52) U.S. Cl.

CPC ........ *H01L 23/562* (2013.01); *H01L 23/3107* (2013.01); *H01L 23/49513* (2013.01); *H01L 23/4952* (2013.01); *H01L 23/49524* (2013.01); *H01L 23/49548* (2013.01)

(58) Field of Classification Search

CPC ............... H01L 23/562; H01L 23/3107; H01L 23/49513
USPC .......................................................... 257/669
See application file for complete search history.

(56) References Cited

U.S. PATENT DOCUMENTS 4,994,897 A * 2/1991 Golubic .............. H01L 23/4334 257/667
2021/0118815 A1* 4/2021 Kosugi .................. H01L 24/48

FOREIGN PATENT DOCUMENTS

| | | |
|---|---|---|
| JP | 2006303216 A | 11/2006 |
| JP | 2017005149 A | 1/2017 |
| JP | 2017-174951 A | 9/2017 |
| JP | 2018163962 A | 10/2018 |
| WO | 2011145176 A1 | 11/2011 |
| WO | 2017169485 A1 | 10/2017 |

OTHER PUBLICATIONS

Office Action issued in Japanese Application No. 2021-109982, dated Mar. 18, 2025, with English translation.
Notice of Reasons for Refusal issued in Patent Application Number: Japanese Patent Application No. 2021-109982, mailed Jun. 10, 2025, with English translation.

* cited by examiner

*Primary Examiner* — Quoc D Hoang
(74) *Attorney, Agent, or Firm* — HSML P. C.

(57) ABSTRACT

A semiconductor device includes: a support member including a main surface facing a thickness direction; a semiconductor element mounted on the main surface; and a bonding layer interposed between the support member and the semiconductor element, wherein the support member is formed with a first protrusion that protrudes from the main surface, and wherein the first protrusion surrounds the semiconductor element when viewed in the thickness direction.

15 Claims, 16 Drawing Sheets

SEMICONDUCTOR DEVICE FOR SUPPRESSING EXCESSIVE WETTING AND SPREADING OF BONDING LAYER

CROSS-REFERENCE TO RELATED APPLICATION

This application is based upon and claims the benefit of priority from Japanese Patent Application No. 2021-109982, filed on Jul. 1, 2021, the entire contents of which are incorporated herein by reference.

TECHNICAL FIELD

The present disclosure relates to a semiconductor device.

BACKGROUND

In the related art, there is disclosed an example of a semiconductor device including a first lead including a first pad having a pad main surface, a semiconductor element mounted on the pad main surface, and a sealing resin that is in contact with the pad main surface and covers the semiconductor element. The semiconductor element is conductively bonded to the first pad via a bonding layer. The semiconductor device further includes a second lead including a second pad and a wire (first bonding wire) conductively bonded to the semiconductor element and the second pad. The second pad and the wire are covered with the sealing resin. As a result, in the semiconductor device, the semiconductor element and members related to a conduction path of the semiconductor element are protected from external factors by the sealing resin.

In the manufacture of the semiconductor device disclosed in the related art, in a case where the semiconductor element is bonded to the first pad via the bonding layer, when the bonding layer melted by reflow becomes excessively wet and spreads, a position deviation of the semiconductor element with respect to the pad main surface becomes relatively large. In this case, when the wire is conductively bonded to the semiconductor element in the manufacture of the semiconductor device, a length of the wire may become excessive. Further, the melted bonding layer may overcome the first pad to reach the second pad. In this case, a short-circuit occurs between the first lead and the second lead. Therefore, it is required to suppress excessive wetting and spreading of the bonding layer.

SUMMARY

Some embodiments of the present disclosure provide a semiconductor device capable of suppressing excessive wetting and spreading of a bonding layer interposed between a support member and a semiconductor element.

According to one embodiment of the present disclosure, there is provided a semiconductor device including: a support member including a main surface facing a thickness direction; a semiconductor element mounted on the main surface; and a bonding layer interposed between the support member and the semiconductor element, wherein the support member is formed with a first protrusion that protrudes from the main surface, and wherein the first protrusion surrounds the semiconductor element when viewed in the thickness direction.

Other features and advantages of the present disclosure will become more apparent with the detailed description given below based on the accompanying drawings.

DETAILED DESCRIPTION

Figure 1:
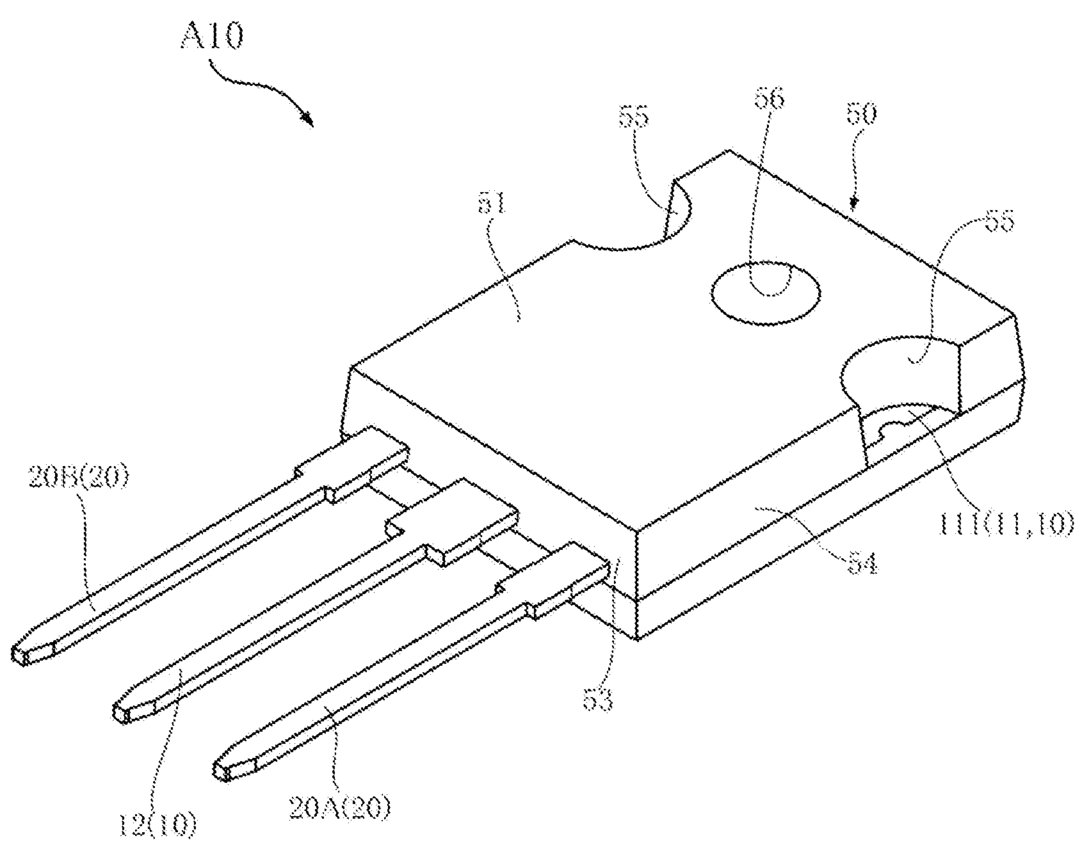
FIG. 1 is a perspective view of a semiconductor device according to a first embodiment of the present disclosure.
Figure 1:
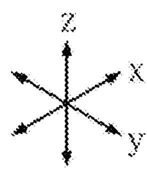

Embodiments for carrying out the present disclosure will now be described with reference to the accompanying drawings.

First Embodiment

A semiconductor device A10 according to a first embodiment of the present disclosure will be described with reference to FIGS. 1 to 10. The semiconductor device A10 is used in electronic apparatuses and the like including a power conversion circuit such as a DC-DC converter. The semiconductor device A10 includes a support member 10, a plurality of terminals 20, a semiconductor element 30, a first bonding layer 39, a plurality of conductive members 40, and a sealing resin 50. Here, in FIGS. 3 and 8, the sealing resin 50 is transparent for the sake of convenience of understanding. In FIG. 3, the transparent sealing resin 50 is indicated by an imaginary line (two-dot chain line).

In the description of the semiconductor device A10, for the sake of convenience, a thickness direction of the support member 10 is referred to as a "thickness direction z." A direction orthogonal to the thickness direction z is referred to as a "first direction x." A direction orthogonal to both the thickness direction z and the first direction x is referred to as a "second direction y." When viewed in the thickness direction z, the first direction x corresponds to a longitudinal direction of the semiconductor device A10. When viewed in the thickness direction z, the second direction y corresponds to a lateral direction of the semiconductor device A10.

Figure 6:
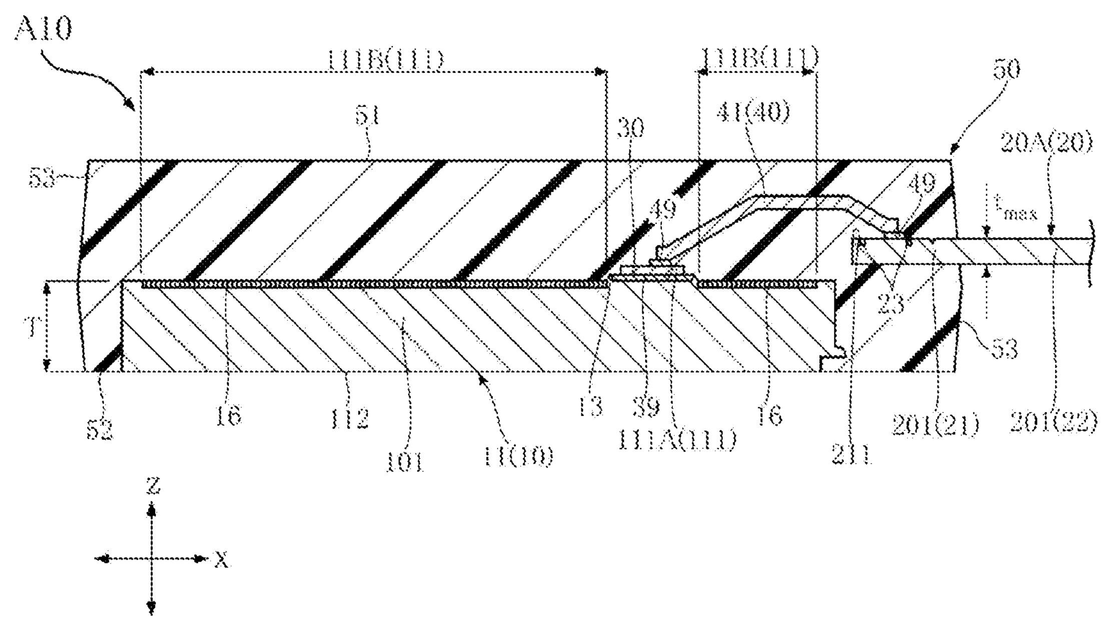
FIG. 6 is a cross-sectional view taken along line VI-VI of FIG. 3.
Figure 7:
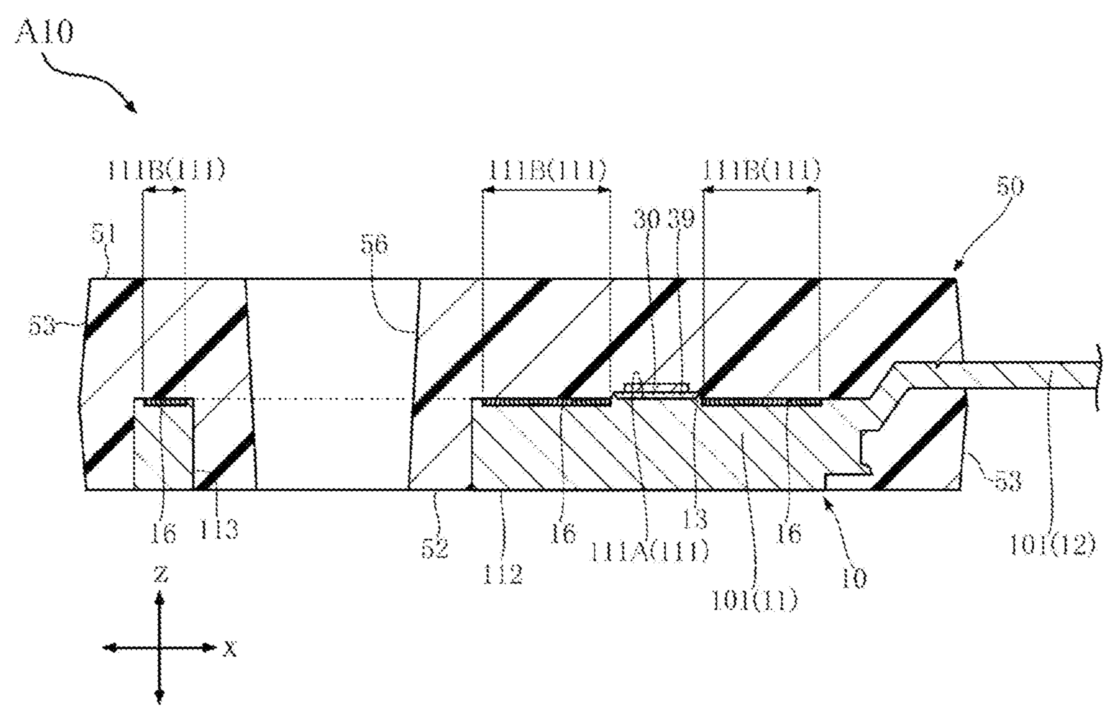
FIG. 7 is a cross-sectional view taken along line VII-VII of FIG. 3.

As shown in FIGS. 3, 6, and 7, the support member 10 mounts the semiconductor element 30 and forms a portion of a conduction path between the semiconductor element 30 and a wiring board on which the semiconductor device A10 is mounted. The support member 10 includes a first base 101. The first base 101 forms a main part of the support member 10. The first base 101 is obtained from a lead frame containing copper (Cu) or a copper alloy. Therefore, the support member 10 has conductivity.

As shown in FIGS. 3 and 7, the support member 10 includes a pad portion 11 and a terminal portion 12. In the semiconductor device A10, the pad portion 11 and the terminal portion 12 include the first base 101. The pad portion 11 includes a first main surface 111, a back surface 112, and a through-hole 113. A portion of the pad portion 11 is covered with the sealing resin 50. The first main surface 111 faces one side of the thickness direction z and is opposed to the semiconductor element 30. The first main surface 111 is in contact with the sealing resin 50. The back surface 112 faces an opposite side of the first main surface 111 in the thickness direction z. The back surface 112 is plated with, for example, tin (Sn). The back surface 112 is exposed from the sealing resin 50. The through-hole 113 extends from the first main surface 111 to the back surface 112 in the thickness direction z and penetrates the pad portion 11. The through-hole 113 has a circular shape when viewed in the thickness direction z. As shown in FIG. 6, a thickness T of the first base 101 included in the pad portion 11 is greater than the maximum thickness $t_{max}$ of a second base 201 (details thereof will be described later) included in each of the plurality of terminals 20.

As shown in FIGS. 3 and 7, the terminal portion 12 includes a portion extending along the first direction x and is connected to the pad portion 11. Therefore, the pad portion 11 and the terminal portion 12 are electrically connected to each other. A part of the terminal portion 12 is covered with the sealing resin 50. The part of the terminal portion 12 covered with the sealing resin 50 is bent when viewed in the second direction y. A surface of a part of the terminal portion 12 exposed from the sealing resin 50 is plated with tin.

Figure 8:
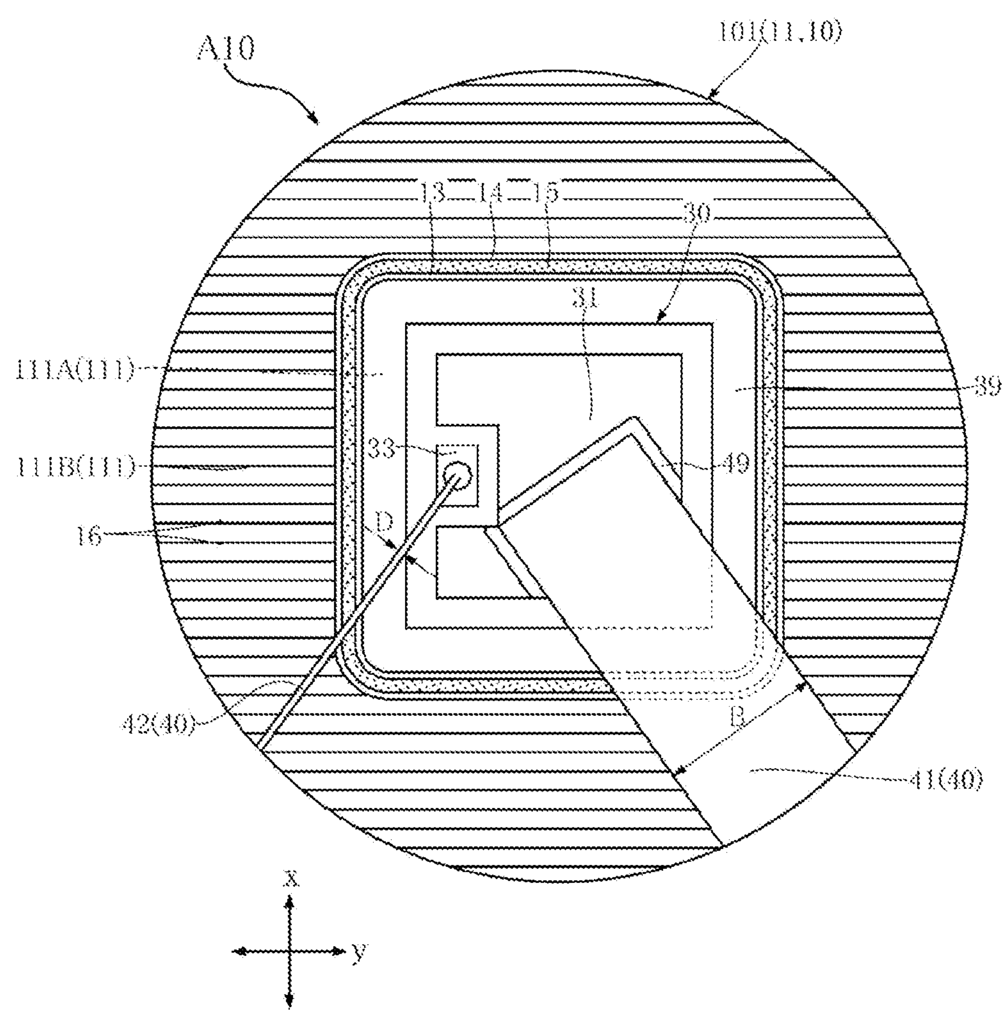
FIG. 8 is a partially enlarged view of the semiconductor element shown in FIG. 3 and its vicinity.
Figure 9:
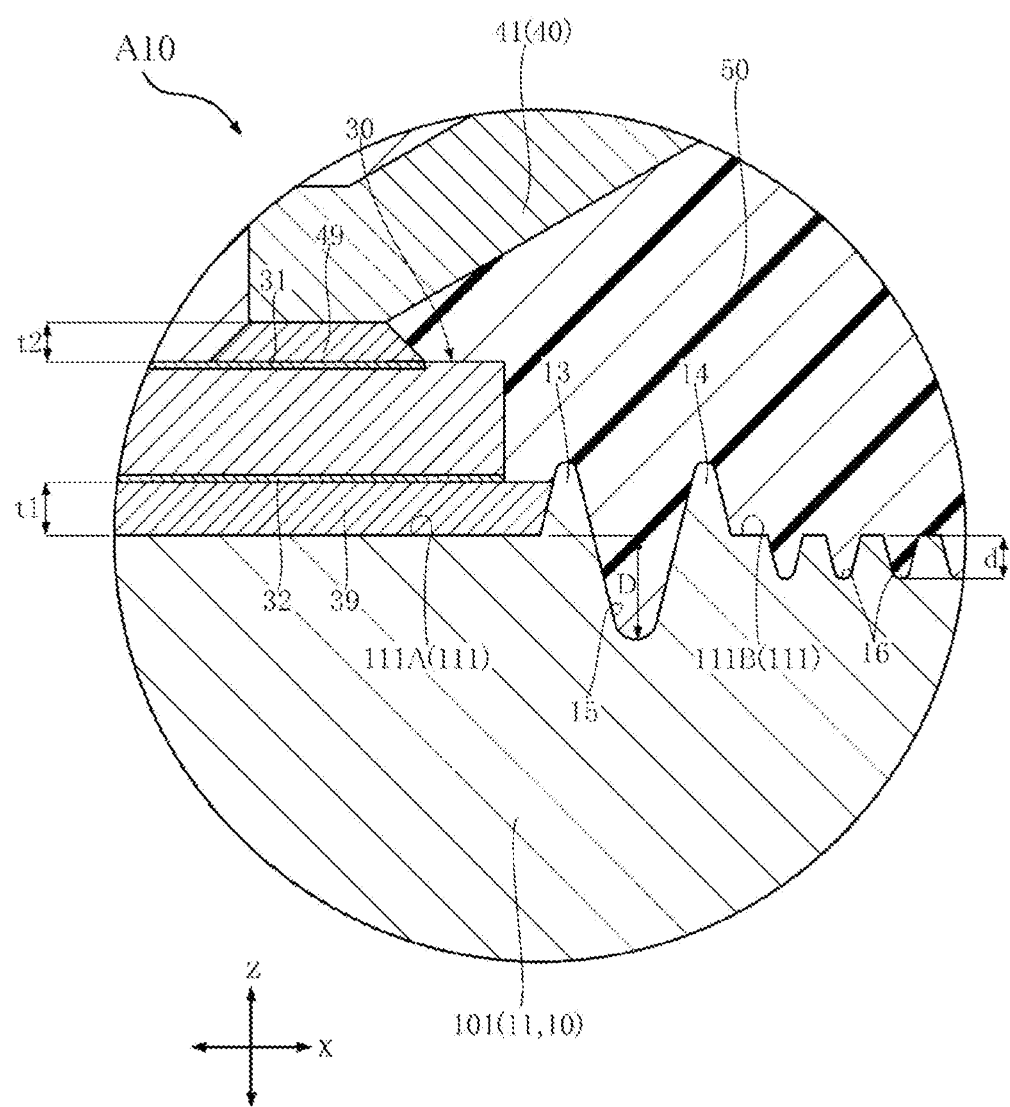
FIG. 9 is a partially enlarged view of a pad portion of a support member shown in FIG. 6 and its vicinity.

As shown in FIGS. 6 to 9, the first main surface 111 of the pad portion 11 includes a first region 111A and a second region 111B. In FIGS. 3 and 8, the second region 111B is shown by a region of a plurality of straight lines. The first region 111A overlaps the semiconductor element 30 when viewed in the thickness direction z. The first region 111A is a flat surface. The second region 111B surrounds the first region 111A. As shown in FIG. 9, the pad portion 11 is formed with a plurality of grooves 16 that are recessed from the second region 111B and are located apart from each other. The plurality of grooves 16 extend in a direction orthogonal to the thickness direction z. The sealing resin 50 enters the plurality of grooves 16. The plurality of grooves 16 are formed by subjecting the second region 111B to laser machining. As the plurality of grooves 16 are formed in the pad portion 11, a surface roughness of the second region 111B is greater than a surface roughness of the first region 111A.

As shown in FIGS. 3, 6, and 7, the semiconductor element 30 is mounted on the first main surface 111 of the pad portion 11 of the support member 10. In the semiconductor device A10, the semiconductor element 30 is an n-channel type MOSFET (Metal-Oxide-Semiconductor Field-Effect Transistor) of a vertical structure. The semiconductor element 30 includes a compound semiconductor substrate. The main material of the compound semiconductor substrate is silicon carbide (SiC). In addition, silicon (Si) may be used as the main material of the compound semiconductor substrate. In the semiconductor device A10, an area of the semiconductor element 30 is 40% or less of an area of the first main surface 111 when viewed in the thickness direction z. The semiconductor element 30 is not limited to the MOSFET. The semiconductor element 30 may be another transistor such as an IGBT (Insulated Gate Bipolar Transistor). Further, the semiconductor element 30 may be an LSI or a diode. The semiconductor element 30 includes a first electrode 31, a second electrode 32, and a third electrode 33.

As shown in FIGS. 8 and 9, the first electrode 31 is provided on the side which the first main surface 111 of the pad portion 11 of the support member 10 faces in the thickness direction z. A current corresponding to power after being converted by the semiconductor element 30 flows through the first electrode 31. That is, the first electrode 31 corresponds to a source of the semiconductor element 30.

As shown in FIG. 9, the second electrode 32 is provided on an opposite side of the first electrode 31 in the thickness direction z. The second electrode 32 faces the first main surface 111 of the pad portion 11 of the support member 10. A current corresponding to power before being converted by the semiconductor element 30 flows through the second electrode 32. That is, the second electrode 32 corresponds to a drain of the semiconductor element 30.

As shown in FIG. 8, the third electrode 33 is provided on the same side as the first electrode 31 in the thickness direction z and is located away from the first electrode 31. A gate voltage for driving the semiconductor element 30 is applied to the third electrode 33. That is, the third electrode 33 corresponds to a gate of the semiconductor element 30. An area of the third electrode 33 is smaller than an area of the first electrode 31 when viewed in the thickness direction z.

As shown in FIG. 9, the first bonding layer 39 is interposed between the first main surface 111 of the pad portion 11 of the support member 10 and the second electrode 32 of the semiconductor element 30. In the semiconductor device A10, the first bonding layer 39 is in contact with the first region 111A of the first main surface 111, and the second electrode 32. The first bonding layer 39 contains a metal element. The metal element is, for example, tin. The first bonding layer 39 is solder. The second electrode 32 is conductively bonded to the pad portion 11 via the first bonding layer 39. Therefore, the terminal portion 12 of the support member 10 corresponds to a drain terminal of the semiconductor device A10.

As shown in FIGS. 8 and 9, the pad portion 11 of the support member 10 is formed with a first protrusion 13, a second protrusion 14, and a recess 15. In FIG. 8, the recess 15 is shown by a region of a plurality of points. The first protrusion 13 protrudes from the first main surface 111 of the pad portion 11. The first protrusion 13 surrounds the semiconductor element 30 when viewed in the thickness direction z. The first protrusion 13 is located between the first region 111A of the first main surface 111 and the second region 111B of the first main surface 111. The second protrusion 14 protrudes from the first main surface 111 in the same manner as the first protrusion 13. The second protrusion 14 surrounds the first protrusion 13. The second protrusion 14 is surrounded by the second region 111B. The first protrusion 13 and the second protrusion 14 are in contact with the sealing resin 50. The recess 15 is recessed from the first main surface 111. The recess 15 surrounds the first protrusion 13 and is surrounded by the second protrusion 14. Therefore, the recess 15 is located between the first protrusion 13 and the second protrusion 14. The sealing resin 50 enters the recess 15.

The recess 15 is formed by subjecting the first main surface 111 to, for example, laser machining. At this time, an output of the laser with which the first main surface 111 is irradiated is set to be larger than an output of the laser with which the second region 111B is irradiated when forming each of the plurality of grooves 16. As a result, a depth D of the recess 15 from the first main surface 111 becomes greater than a depth d of each of the plurality of grooves 16 from the second region 111B. With the formation of the recess 15, the first base 101 of the pad portion 11 rises from the first main surface 111. This rising is made along a direction in which the recess 15 extends. A portion raised from the first main surface 111 becomes the first protrusion 13 and the second protrusion 14.

As shown in FIGS. 3 and 6, the plurality of terminals 20 are located apart from the support member 10 and are electrically connected to the semiconductor element 30. As a result, the plurality of terminals 20 form a portion of the conductive path between the semiconductor element 30 and the wiring board on which the semiconductor device A10 is mounted. The plurality of terminals 20 include the second base 201. The second base 201 forms the main part of the plurality of terminals 20. The second base 201 is also obtained from the lead frame from which the first base 101 of the support member 10 is obtained. Therefore, the second base 201 contains copper or a copper alloy.

Figure 10:
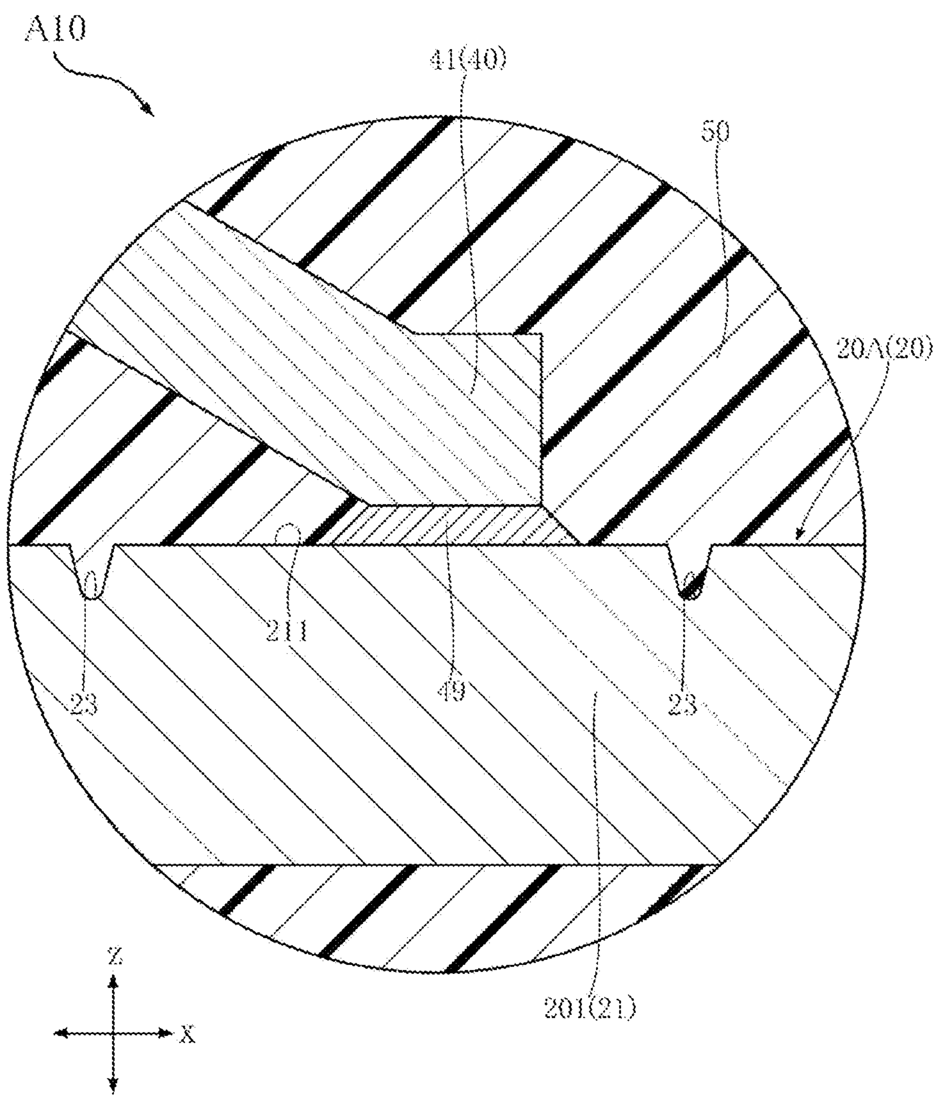
FIG. 10 is a partially enlarged view of a cover portion of a terminal (first terminal) shown in FIG. 6 and its vicinity.

As shown in FIGS. 3 and 6, the plurality of terminals 20 include a covering portion 21 and an exposed portion 22. In the semiconductor device A10, the covering portion 21 and the exposed portion 22 include the second base 201. The covering portion 21 is covered with the sealing resin 50. The covering portion 21 includes a second main surface 211. The second main surface 211 faces the same side as the first main surface 111 of the pad portion 11 of the support member 10 in the thickness direction z. The second main surface 211 is in contact with the sealing resin 50. As shown in FIGS. 3 and 10, a plurality of grooves 23 recessed from the second main surface 211 are formed in the covering portion 21. The plurality of grooves 23 surround a portion of the second main surface 211 with which a second bonding layer 49 (details thereof will be described later) is in contact. The sealing resin 50 enters in the plurality of grooves 23. The plurality of grooves 23 are formed by subjecting the second main surface 211 to laser machining, similarly to the plurality of grooves 16 formed in the pad portion 11. The exposed portion 22 is connected to the covering portion 21 and is exposed from the sealing resin 50. The exposed portion 22 extends from the covering portion 21 to the side away from the pad portion 11 of the support member 10 in the first direction x. The surface of the exposed portion 22 is plated with, for example, tin.

As shown in FIG. 3, in the semiconductor device A10, the plurality of terminals 20 include a first terminal 20A and a second terminal 20B. The first terminal 20A extends along the first direction x and is located near the terminal portion 12 of the support member 10 in the second direction y. The first terminal 20A is electrically connected to the first electrode 31 of the semiconductor element 30. Therefore, the first terminal 20A corresponds to a source terminal of the semiconductor device A10.

As shown in FIG. 3, the second terminal 20B extends along the first direction x and is located on the opposite side of the first terminal 20A with the terminal portion 12 of the support member 10 interposed therebetween in the second direction y. The second terminal 20B is electrically connected to the third electrode 33 of the semiconductor element 30. Therefore, the second terminal 20B corresponds to a gate terminal of the semiconductor device A10.

Figure 5:
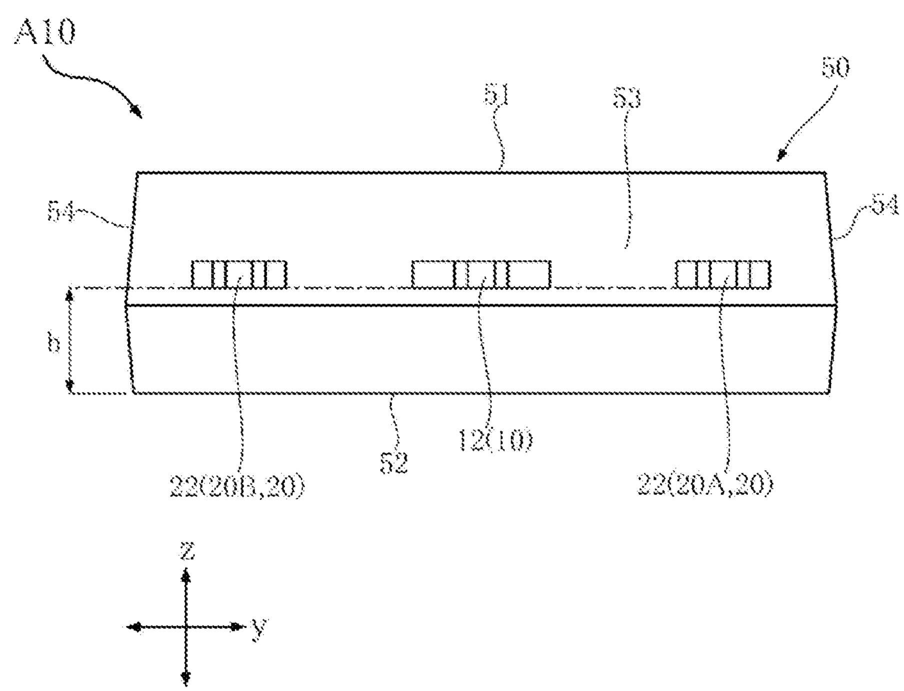
FIG. 5 is a front view of the semiconductor device shown in FIG. 1.

As shown in FIG. 5, in the semiconductor device A10, the portion exposed from the sealing resin 50 of the terminal portion 12 of the support member 10, the exposed portion 22 of the first terminal 20A, and the exposed portion 22 of the second terminal 20B have the same height h. When viewed in the second direction y, a part of the terminal portion 12 overlaps the exposed portion 22 of the first terminal 20A and the exposed portion 22 of the second terminal 20B.

As shown in FIG. 3, the plurality of conductive members 40 are conductively bonded to the semiconductor element 30 and the plurality of terminals 20. As a result, mutual conduction between the semiconductor element 30 and the plurality of terminals 20 is achieved. The plurality of conductive members 40 include a first member 41 and a second member 42.

As shown in FIGS. 3, 9, and 10, the first member 41 is conductively bonded to the first electrode 31 of the semiconductor element 30 and the second main surface 211 of the covering portion 21 of the first terminal 20A. As a result, the first terminal 20A is electrically connected to the first electrode 31. The composition of the first member 41 includes copper. In the semiconductor device A10, the first member 41 is a metal clip. The first member 41 is conductively bonded to the first electrode 31 and the second main surface 211 via the second bonding layer 49. The second bonding layer 49 contains a metal element. The metal element is, for example, tin. The second bonding layer 49 is solder. As shown in FIG. 9, a thickness t2 of the second bonding layer 49 is smaller than a thickness t1 of the first bonding layer 39. In addition, the first member 41 may be a wire. In this case, since the first member 41 is formed by wire bonding, the second bonding layer 49 becomes unnecessary.

As shown in FIG. 3, the second member 42 is conductively bonded to the third electrode 33 of the semiconductor element 30 and the second main surface 211 of the covering portion 21 of the second terminal 20B. As a result, the second terminal 20B is electrically connected to the third electrode 33. The second member 42 is a wire. The second member 42 is formed by wire bonding. The composition of the second member 42 includes aluminum (Al).

The differences between the first member 41 and the second member 42 will be described below. Young's modulus (elastic modulus) of the second member 42 is smaller than Young's modulus of the first member 41. This is based on the feature that, as described above, the composition of the first member 41 contains copper and the composition of the second member 42 contains aluminum. Therefore, a linear expansion coefficient of the second member 42 is greater than a linear expansion coefficient of the first member 41. In addition, thermal conductivity of the second member 42 is smaller than thermal conductivity of the first member 41. Further, as shown in FIG. 8, a width B of the first member 41 is larger than a width (diameter) D of the second member 42.

As shown in FIGS. 6 and 7, the sealing resin 50 covers the semiconductor element 30, the plurality of conductive members 40, and a portion of each of the support member 10 and the plurality of terminals 20. The sealing resin 50 has electrical insulation. The sealing resin 50 is made of a material containing, for example, a black epoxy resin. The sealing resin 50 has a top surface 51, a bottom surface 52, a pair of first side surfaces 53, a pair of second side surfaces 54, a pair of openings 55, and a mounting hole 56.

As shown in FIGS. 6 and 7, the top surface 51 faces the same side as the first main surface 111 of the pad portion 11 of the support member 10 in the thickness direction z. As shown in FIGS. 5 to 7, the bottom surface 52 faces the opposite side of the top surface 51 in the thickness direction z. The back surface 112 of the pad portion 11 is exposed from the bottom surface 52.

Figure 2:
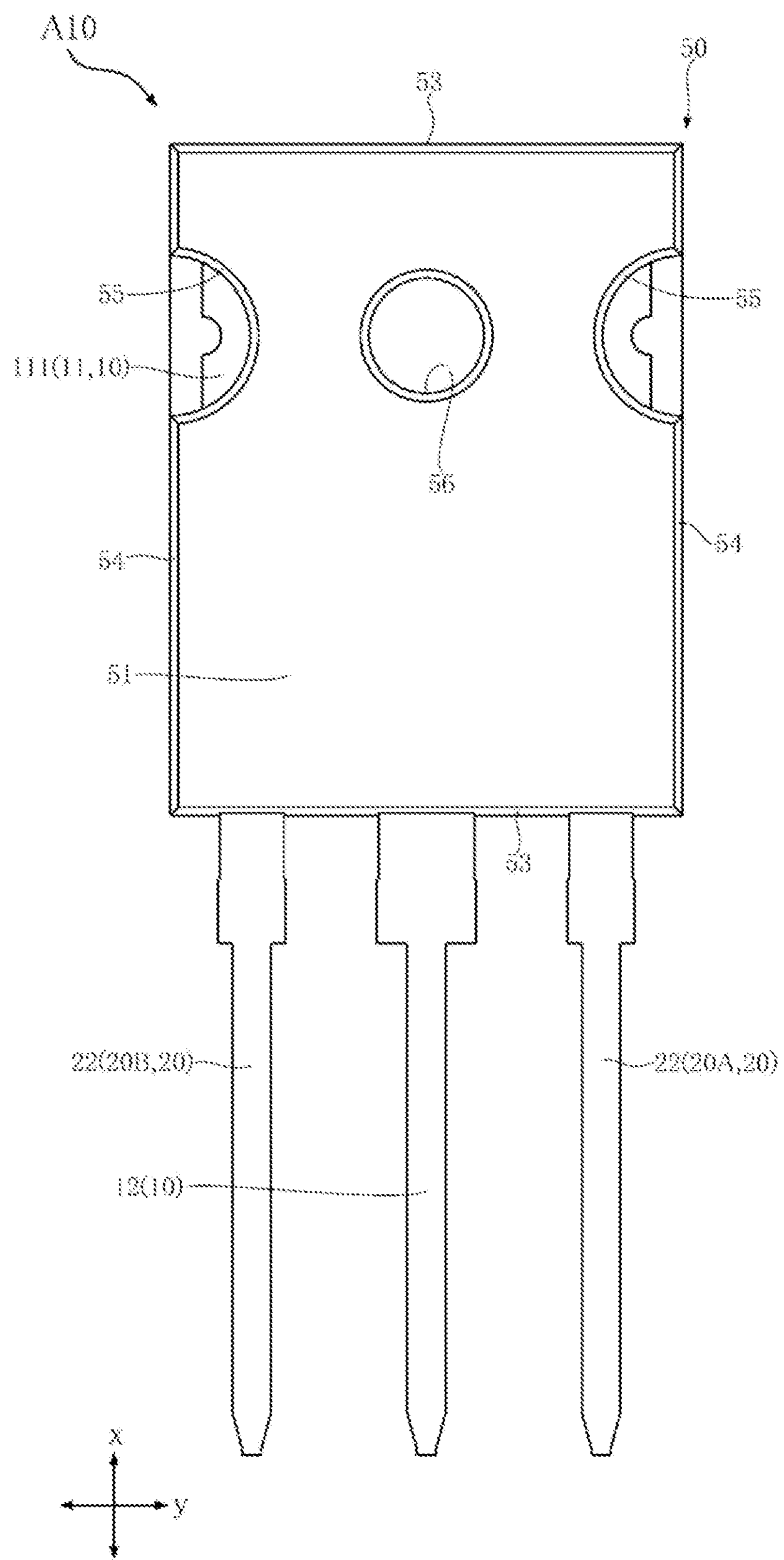
FIG. 2 is a plan view of the semiconductor device shown in FIG. 1.
Figure 3:
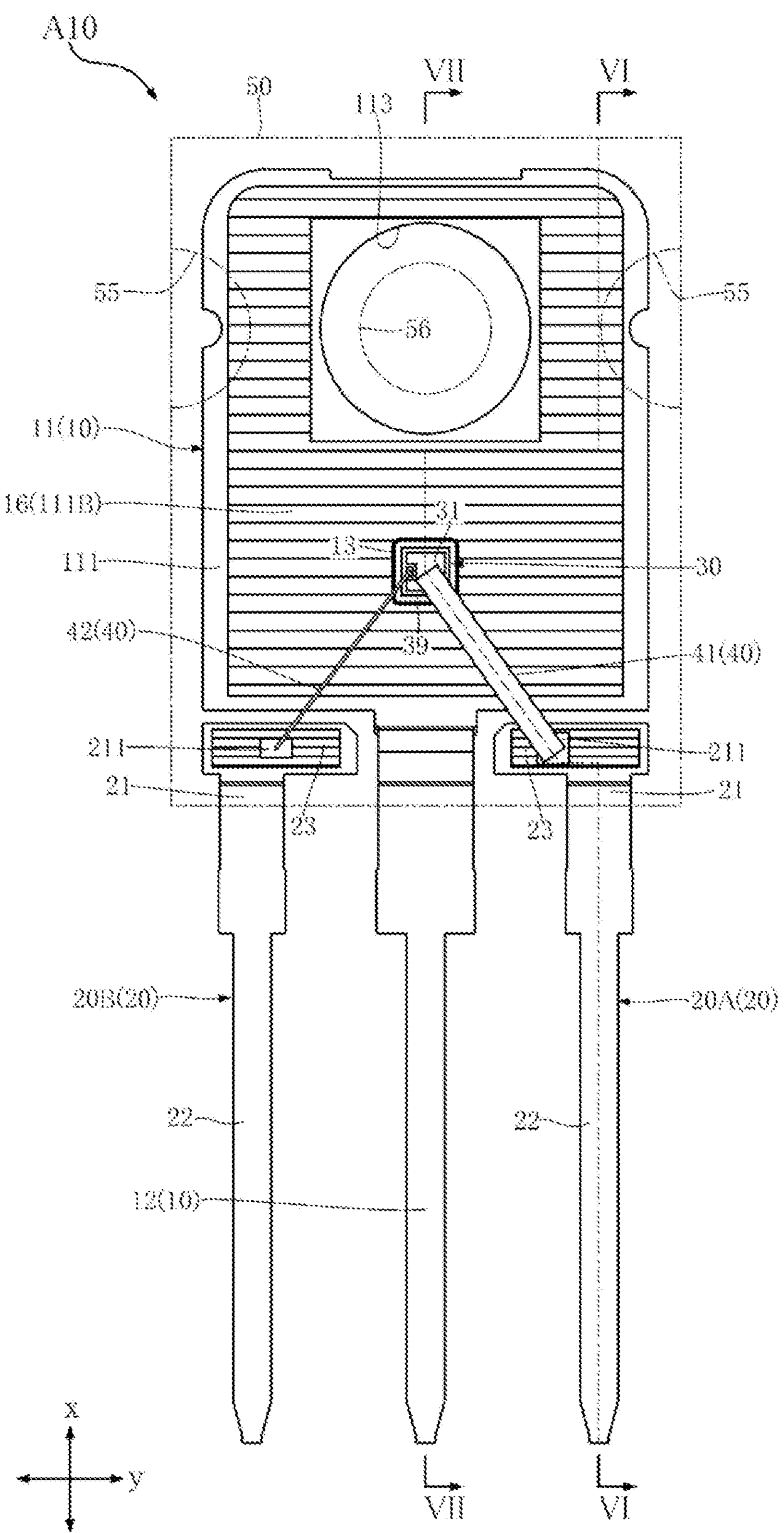
FIG. 3 is a plan view corresponding to FIG. 2, in which a sealing resin is transparent.
Figure 4:
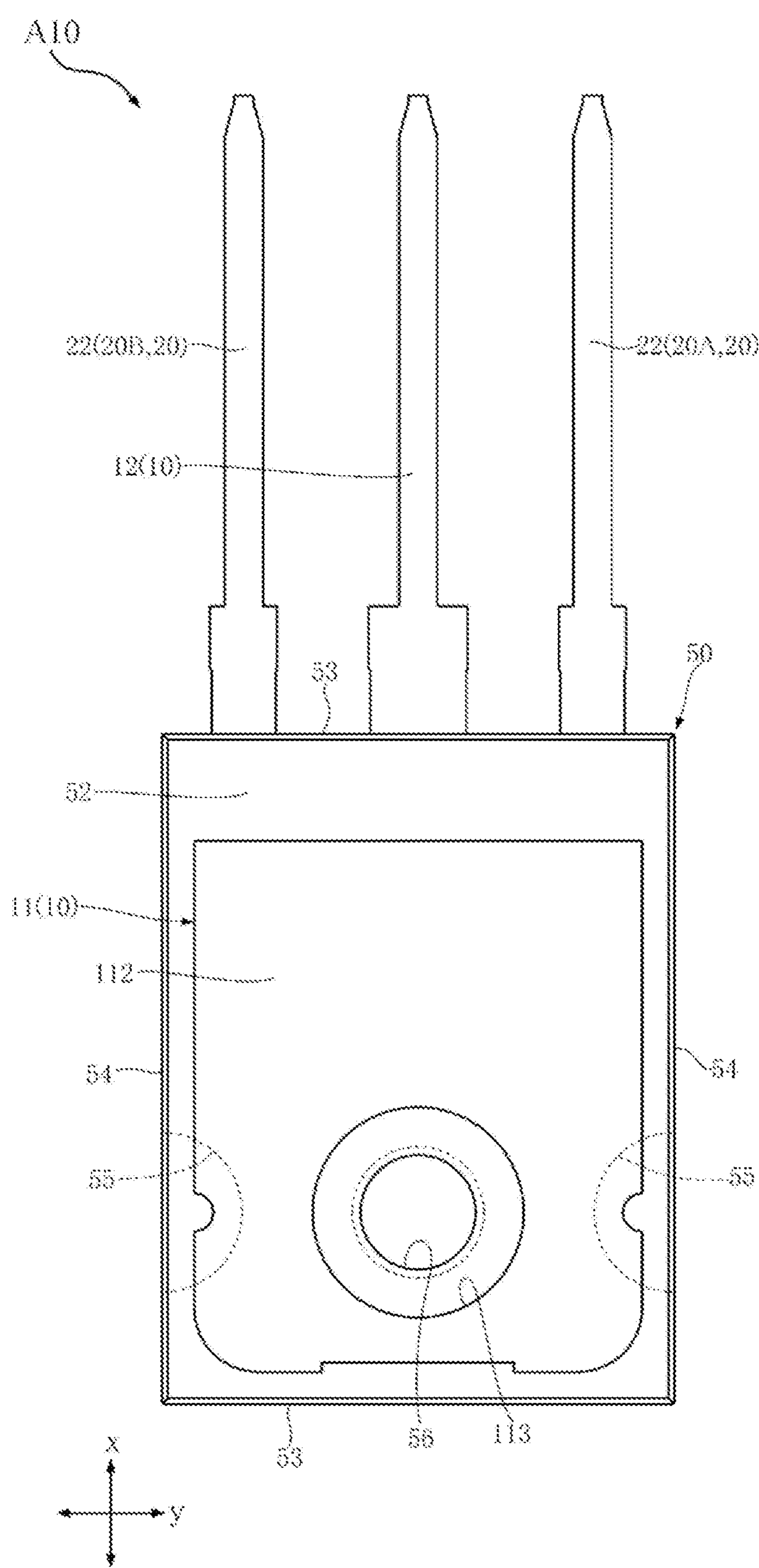
FIG. 4 is a bottom view of the semiconductor device shown in FIG. 1.

As shown in FIGS. 2 and 4, the pair of first side surfaces 53 are located apart from each other in the first direction x. The pair of first side surfaces 53 are connected to the top surface 51 and the bottom surface 52. As shown in FIG. 5, a portion of the terminal portion 12 of the support member 10 and the exposed portion 22 of the first terminal 20A and the second terminal 20B are exposed from one of the pair of first side surfaces 53.

As shown in FIGS. 2, 4, and 5, the pair of second side surfaces 54 are located apart from each other in the second direction y. The pair of second side surfaces 54 are connected to the top surface 51 and the bottom surface 52. As shown in FIG. 2, the pair of openings 55 are located apart from each other in the second direction y. Each of the pair of openings 55 is recessed inward from the top surface 51 and one of the pair of second side surfaces 54 toward the sealing resin 50. The first main surface 111 of the pad portion 11 of the support member 10 is exposed from the pair of openings 55. As shown in FIGS. 2, 4, and 7, the mounting hole 56 extends from the top surface 51 to the bottom surface 52 in the thickness direction z and penetrates the sealing resin 50. When viewed in the thickness direction z, the mounting hole 56 is included in the through-hole 113 of the pad portion 11 of the support member 10. An inner peripheral surface of the pad portion 11 that defines the through-hole 113 is covered with the sealing resin 50. As a result, the maximum dimension of the mounting hole 56 is smaller than a dimension of the through-hole 113 when viewed in the thickness direction z.

Modification of the First Embodiment

Figure 11:
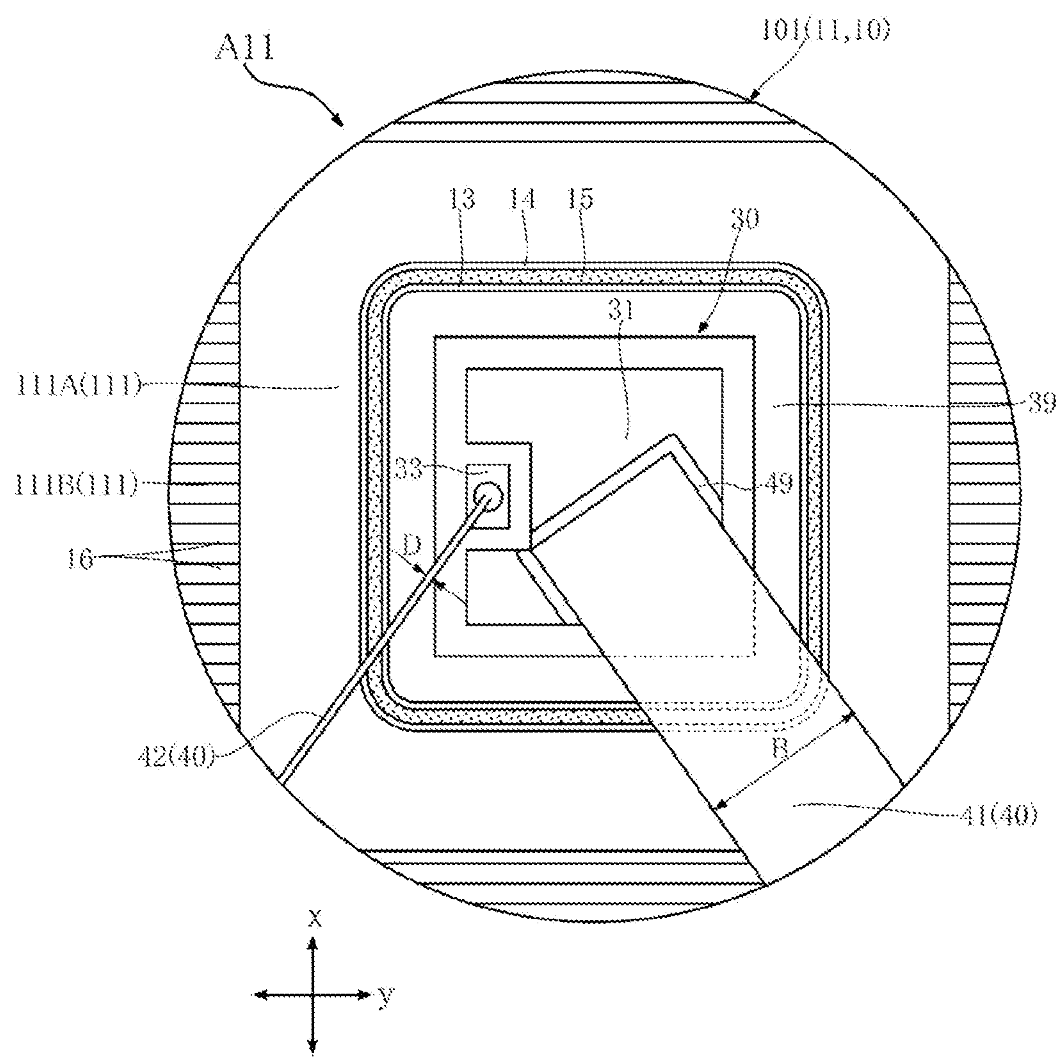
FIG. 11 is a partially enlarged plan view of a semiconductor element and its vicinity according to a modification of the semiconductor device shown in FIG. 1, in which the sealing resin is transparent.

Next, a semiconductor device A11, which is a modification of the semiconductor device A10, will be described with reference to FIG. 11. Here, the position of FIG. 11 is the same as the position of FIG. 8. Similar to FIG. 8, the sealing resin 50 is transparent in FIG. 11. Further, in FIG. 11, the second region 111B of the first main surface 111 of the pad portion 11 (the support member 10) is shown by a region of a plurality of straight lines, and the recess 15 formed in the pad portion 11 is shown by a region of a plurality of points.

The semiconductor device A11 is different from the semiconductor device A10 in the configuration of the first main surface 111 of the pad portion 11 of the support member 10. As shown in FIG. 11, a distance (a distance in a direction orthogonal to the thickness direction z) from the second protrusion 14 to a boundary between the first region 111A of the first main surface 111 and the second region 111B of the first main surface 111 is longer than the corresponding distance in the semiconductor device A10. As a result, the boundary between the first region 111A and the second region 111B surrounds the second protrusion 14.

Next, operation and effects of the semiconductor device A10 will be described.

The semiconductor device A10 includes the support member 10 including the main surface (the first main surface 111), the semiconductor element 30 mounted on the main surface, and the bonding layer (the first bonding layer 39) interposed between the support member 10 and the semiconductor element 30. The support member 10 is formed with the first protrusion 13 protruding from the first main surface 111. The first protrusion 13 surrounds the semiconductor element 30 when viewed in the thickness direction z. According to this configuration, in a case where the semiconductor element 30 is bonded to the support member 10 in the manufacture of the semiconductor device A10, when the first bonding layer 39 melted by reflow tries to wet and spread on the first main surface 111 in a direction orthogonal to the thickness direction z, the first bonding layer 39 comes into contact with the first protrusion 13. As a result, the wetting and spreading of the first bonding layer 39 are restricted. Therefore, according to the semiconductor device A10, it is possible to suppress excessive wetting and spreading of the first bonding layer 39 interposed between the support member 10 and the semiconductor element 30.

The semiconductor device A10 further includes the sealing resin 50 that covers at least a portion of the support member 10 and the semiconductor element 30. The sealing resin 50 is in contact with the first main surface 111 of the support member 10. The first main surface 111 includes the first region 111A that overlaps the semiconductor element 30 when viewed in the thickness direction z, and the second region 111B having surface roughness larger than that of the first region 111A. The second region 111B surrounds the first region 111A. The sealing resin 50 in contact with the second region 111B exhibits an anchoring effect on the support member 10. As a result, bonding strength of the sealing resin 50 with respect to the main surface 111 increases. Therefore, it is possible to improve adhesion between the support member 10 and the sealing resin 50.

Further, when the semiconductor device A10 is used, a thermal strain is generated in the support member 10 due to heat generated from the semiconductor element 30. As a result, a shear stress is generated at the interface between the first main surface 111 and the sealing resin 50. When the adhesion between the support member 10 and the sealing resin 50 is improved, the shear stress reaching the first bonding layer 39 is reduced. Therefore, cracks generated in the first bonding layer 39 can be suppressed. When the cracks generated in the first bonding layer 39 are suppressed, it is possible to prevent the semiconductor element 30 from peeling off from the support member 10 and electrical resistance of the first bonding layer 39 from increasing (in a case where the first bonding layer 39 functions as a conductive member).

The first protrusion 13 is located between the first region 111A of the first main surface 111 and the second region 111B of the first main surface 111. As a result, since it is possible to prevent the first bonding layer 39 melted by reflow from reaching the second region 111B, it is possible to prevent a decrease in the adhesion between the support member 10 and the sealing resin 50.

The support member 10 is formed with the second protrusion 14 that protrudes from the first main surface 111 and surrounds the first protrusion 13. The second protrusion 14 is surrounded by the second region 111B of the first main surface 111. As a result, even in a case where the first bonding layer 39 melted by reflow overcomes the first protrusion 13, the first bonding layer 39 comes into contact with the second protrusion 14, such that the wetting and spreading of the first bonding layer 39 are doubly restricted.

Therefore, it is possible to more reliably suppress the arrival of the first bonding layer 39 at the second region 111B while effectively suppressing the excessive wetting and spreading of the first bonding layer 39.

The support member 10 is formed with the recess 15 that is recessed from the first main surface 111 and surrounds the first protrusion 13. The recess 15 is surrounded by the second protrusion 14. As a result, even in a case where the first bonding layer 39 melted by reflow overcomes the first protrusion 13, the first bonding layer 39 enters the recess 15. For this reason, it is difficult for the first bonding layer 39 to reach the second protrusion 14. Therefore, it is possible to more effectively suppress the excessive wetting and spreading of the first bonding layer 39.

As the first protrusion 13 and the second protrusion 14 come into contact with the sealing resin 50, the support member 10 exhibits an anchoring effect on the sealing resin 50. Further, as the sealing resin 50 enters the recess 15, the sealing resin 50 exhibits an anchoring effect on the support member 10. As a result, the adhesion between the support member 10 and the sealing resin 50 is further improved.

The semiconductor device A10 further includes a conductive member 40 (the first member 41) conductively bonded to the first electrode 31 of the semiconductor element 30 and the terminal 20 (the first terminal 20A). The conductive member 40 is conductively bonded to the second main surface 211 of the terminal 20 via the second bonding layer 49. A portion of the second main surface 211 to which the second bonding layer 49 is in contact is surrounded by the plurality of grooves 23 recessed from the second main surface 211. As a result, when the sealing resin 50 comes into contact with the second main surface 211, the sealing resin 50 exhibits an anchoring effect on the terminal 20. For this reason, the adhesion between the terminal 20 and the sealing resin 50 is improved, and the shear stress generated at the interface between the second main surface 211 and the sealing resin 50 is less likely to reach the second bonding layer 49. Therefore, since generation of cracks in the second bonding layer 49 are suppressed, it is possible to prevent pitting corrosion from occurring in the conductive member 40.

The thickness t1 of the first bonding layer 39 is larger than the thickness t2 of the second bonding layer 49. As a result, when the semiconductor device A10 is used, heat generated from the semiconductor element 30 is likely to be conducted to the pad portion 11 of the support member 10 having a volume larger than that of each of the plurality of conductive members 40. This makes it possible to improve heat dissipation of the semiconductor device A10.

The composition of the first base 101 of the support member 10 includes copper. Further, the thickness T of the first base 101 of the pad portion 11 of the support member 10 is larger than the maximum thickness $t_{max}$ of the terminal 20. As a result, it is possible to increase efficiency of heat conduction in the direction orthogonal to the thickness direction z while improving the heat conductivity of the pad portion 11. This contributes to the improvement of the heat dissipation of the support member 10.

The pad portion 11 includes the back surface 112 facing the opposite side of the first main surface 111 in the thickness direction z. The back surface 112 is exposed from the bottom surface 52 of the sealing resin 50. As a result, while the sealing resin 50 protects the semiconductor element 30 and the conductive member 40 from external factors, it is possible to avoid a decrease in heat dissipation of the semiconductor device A10.

Second Embodiment

Figure 12:
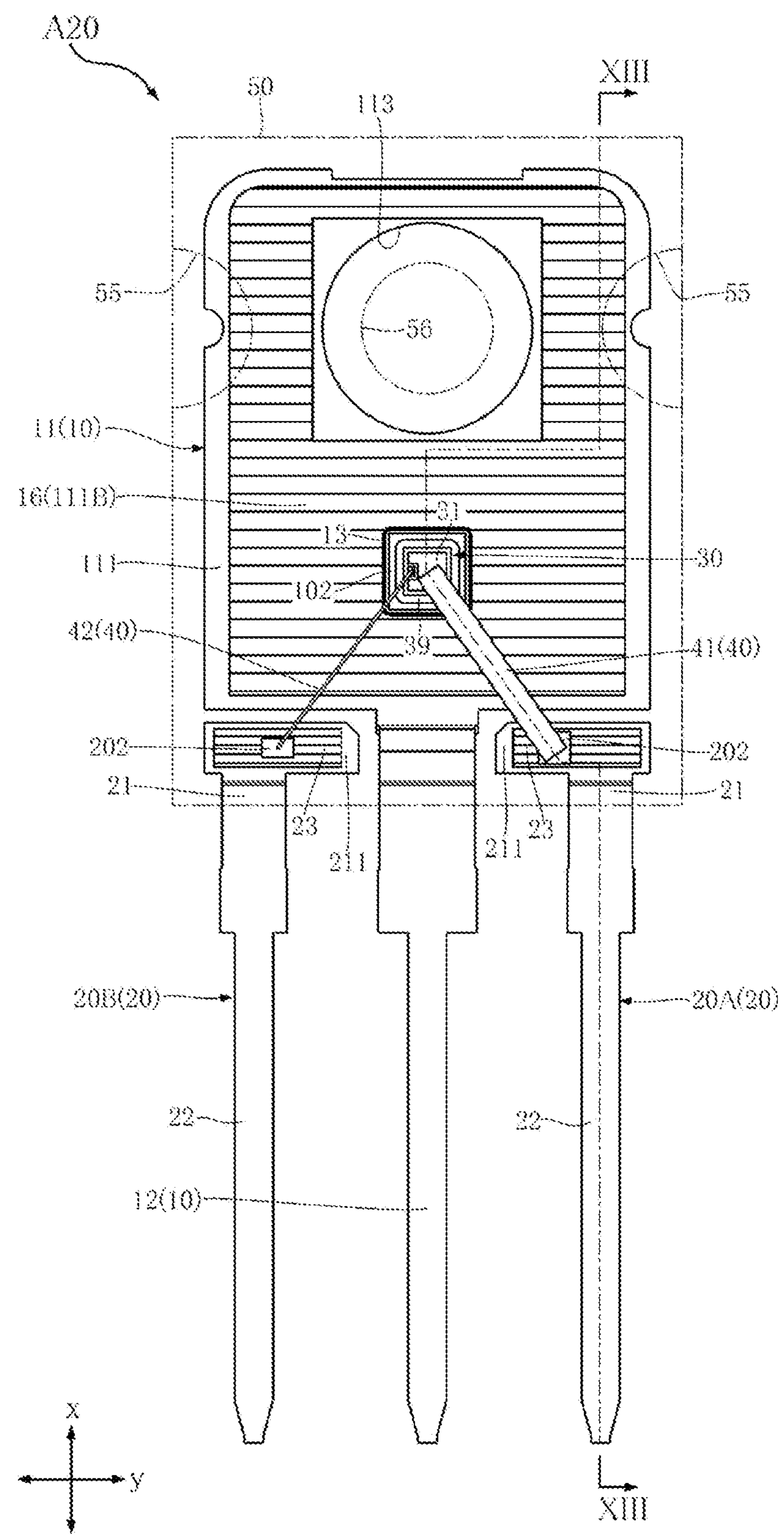
FIG. 12 is a plan view of a semiconductor device according to a second embodiment of the present disclosure, in which a sealing resin is transparent.

A semiconductor device A20 according to a second embodiment of the present disclosure will be described with reference to FIGS. 12 to 16. In these figures, the same or similar elements of the above-described semiconductor device A10 are denoted by the same reference numerals, and explanation thereof will be omitted. Here, in FIGS. 12 and 14, the sealing resin 50 is transparent for the sake of convenience of understanding. In FIG. 12, the transparent sealing resin 50 is indicated by an imaginary line. In FIGS. 12 and 14, the second region 111B of the first main surface 111 of the pad portion 11 (the support member 10) is shown by a region of a plurality of straight lines. In FIG. 14, the recess 15 formed in the pad portion 11 is shown by a region of a plurality of points.

The semiconductor device A20 is different from the above-described semiconductor device A10 in the configuration of the support member 10 and the plurality of terminals 20.

As shown in FIGS. 12 to 15, the pad portion 11 of the support member 10 includes a first metal layer 102 in addition to the first base 101. In this case, the first base 101 of the pad portion 11 includes the first main surface 111. The first metal layer 102 is laminated on the first region 111A of the first main surface 111 and is in contact with the first region 111A. The thickness of the first metal layer 102 is smaller than the thickness of the first base 101. The composition of the first metal layer 102 contains silver (Ag). In addition, the composition of the first metal layer 102 may contain nickel (Ni).

Figure 14:
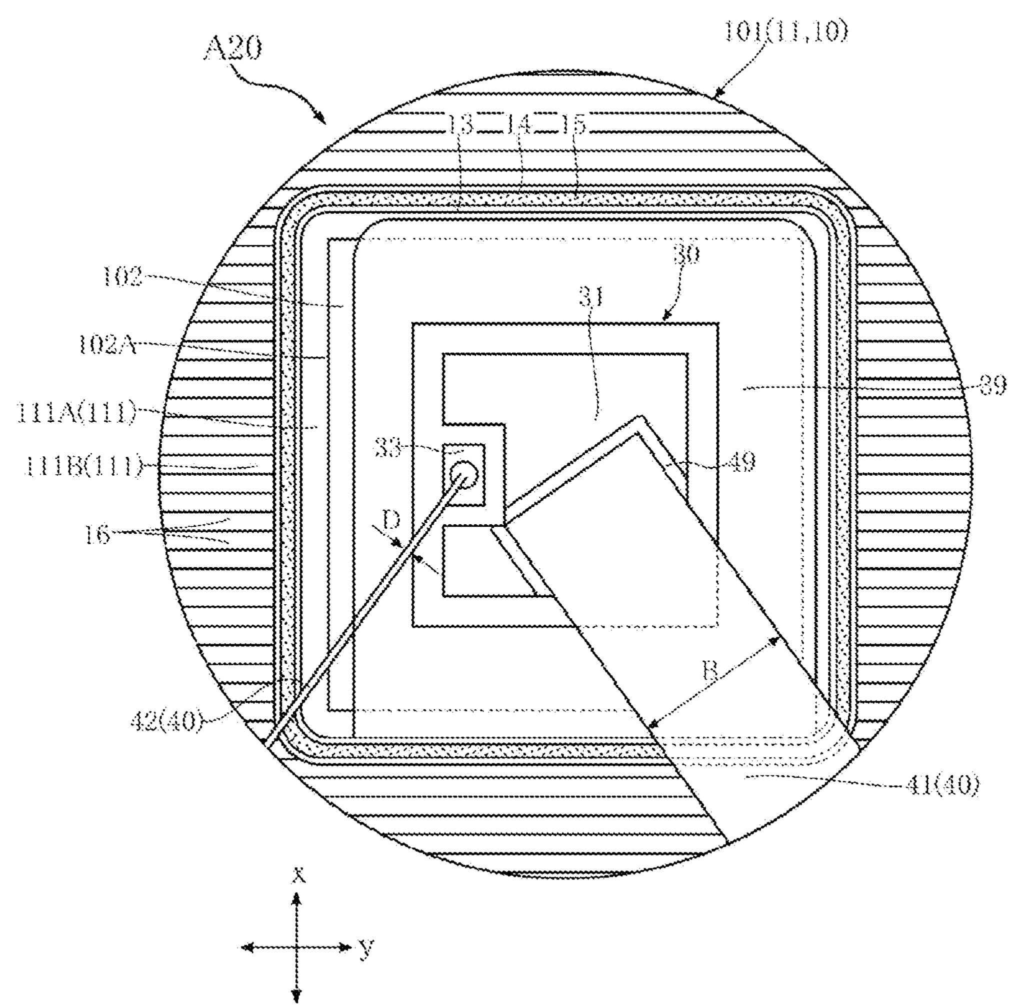
FIG. 14 is a partially enlarged view of a semiconductor element shown in FIG. 12 and its vicinity.
Figure 15:
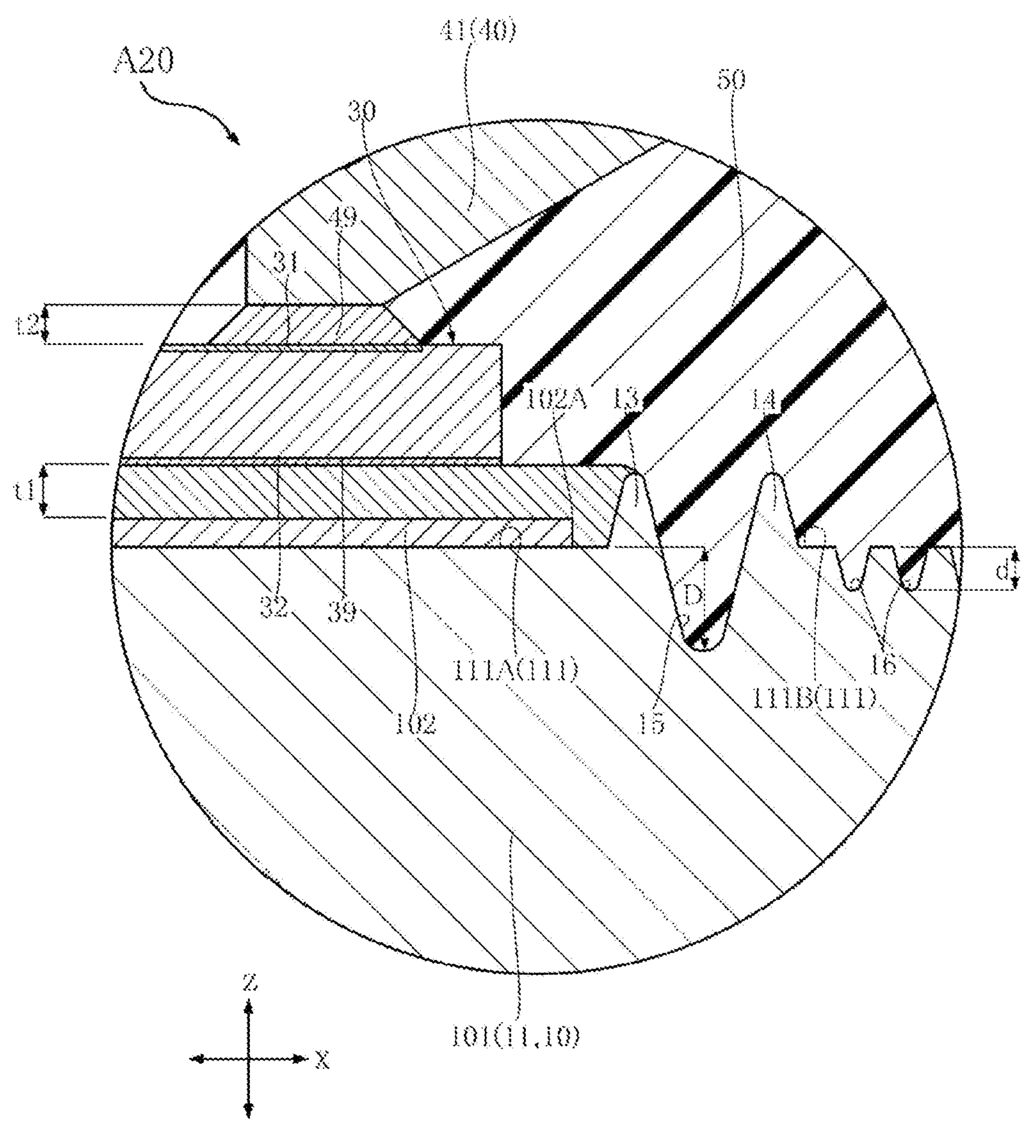
FIG. 15 is a partially enlarged view of a pad portion of a support member shown in FIG. 13 and its vicinity.

As shown in FIG. 15, the first bonding layer 39 is in contact with the first metal layer 102 of the pad portion 11 and the second electrode 32 of the semiconductor element 30. As shown in FIG. 14, the peripheral edge 102A of the first metal layer 102 surrounds the semiconductor element 30 when viewed in the thickness direction z. The first protrusion 13 formed on the pad portion 11 and the second region 111B of the first main surface 111 of the pad portion 11 surround the first metal layer 102.

Figure 13:
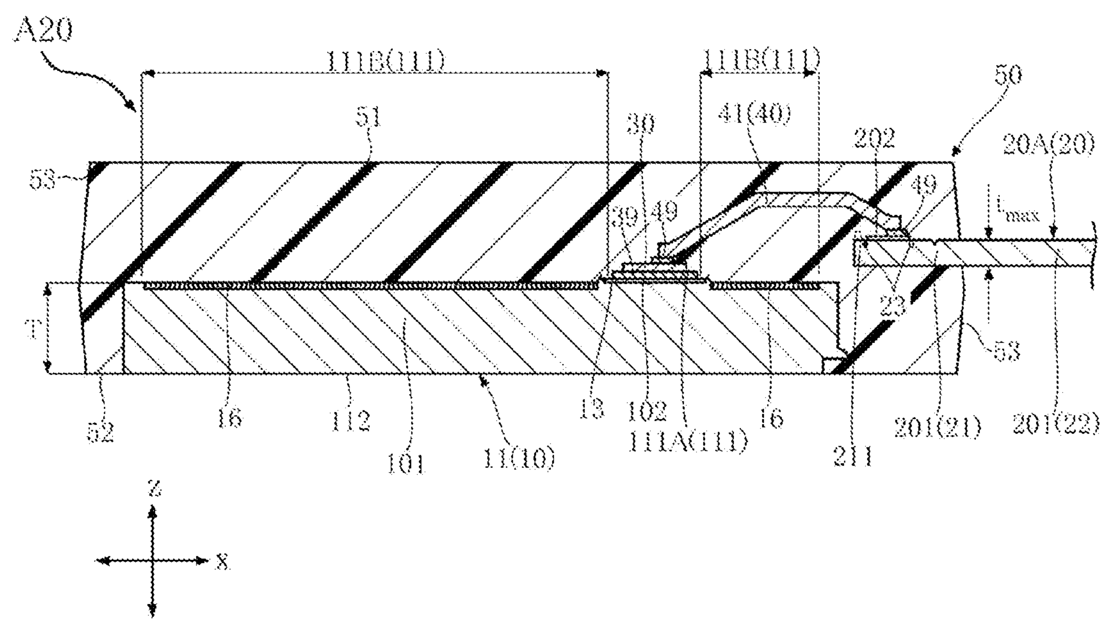
FIG. 13 is a cross-sectional view taken along line XIII-XIII of FIG. 12.
Figure 16:
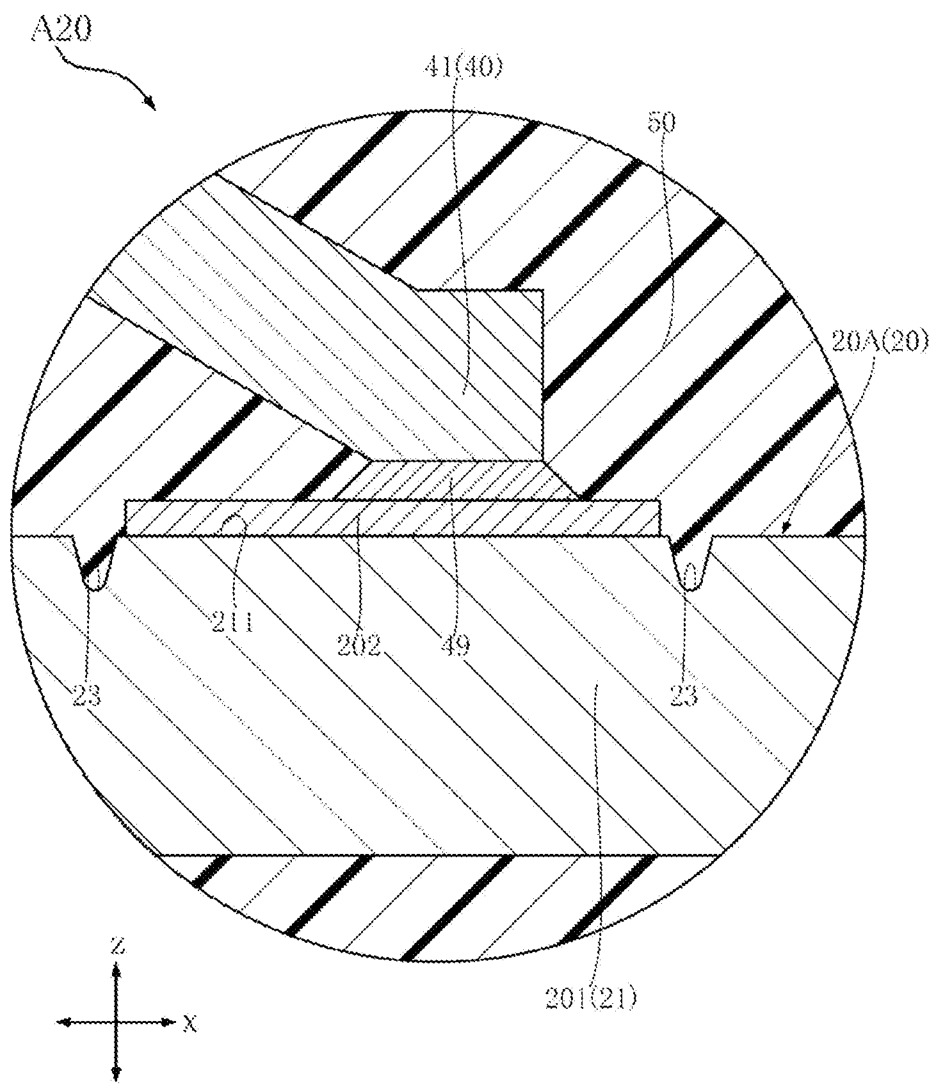
FIG. 16 is a partially enlarged view of a cover portion of a terminal (first terminal) shown in FIG. 13 and its vicinity.

As shown in FIGS. 12, 13, and 16, the covering portion 21 of the plurality of terminals 20 includes a second metal layer 202 in addition to the second base 201. In this case, the second base 201 of the covering portion 21 includes the second main surface 211. The second metal layer 202 is laminated on the second main surface 211. The thickness of the second metal layer 202 is smaller than the thickness of the second base 201. The second metal layer 202 is surrounded by the plurality of grooves 23 formed in the covering portion 21. When viewed in the thickness direction z, the area of the second metal layer 202 is smaller than the area of the first metal layer 102 of the pad portion 11 of the support member 10. The composition of the second metal layer 202 includes silver. In addition, the composition of the second metal layer 202 may include nickel.

As shown in FIGS. 12, 15, and 16, the first member 41 is conductively bonded to the first electrode 31 of the semiconductor element 30 and the second metal layer 202 of the covering portion 21 of the first terminal 20A. The second bonding layer 49 is in contact with the second metal layer 202. As shown in FIGS. 12 and 14, the second member 42 is conductively bonded to the third electrode 33 of the semiconductor element 30 and the second metal layer 202 of the covering portion 21 of the second terminal 20B.

Modification of Second Embodiment

Figure 17:
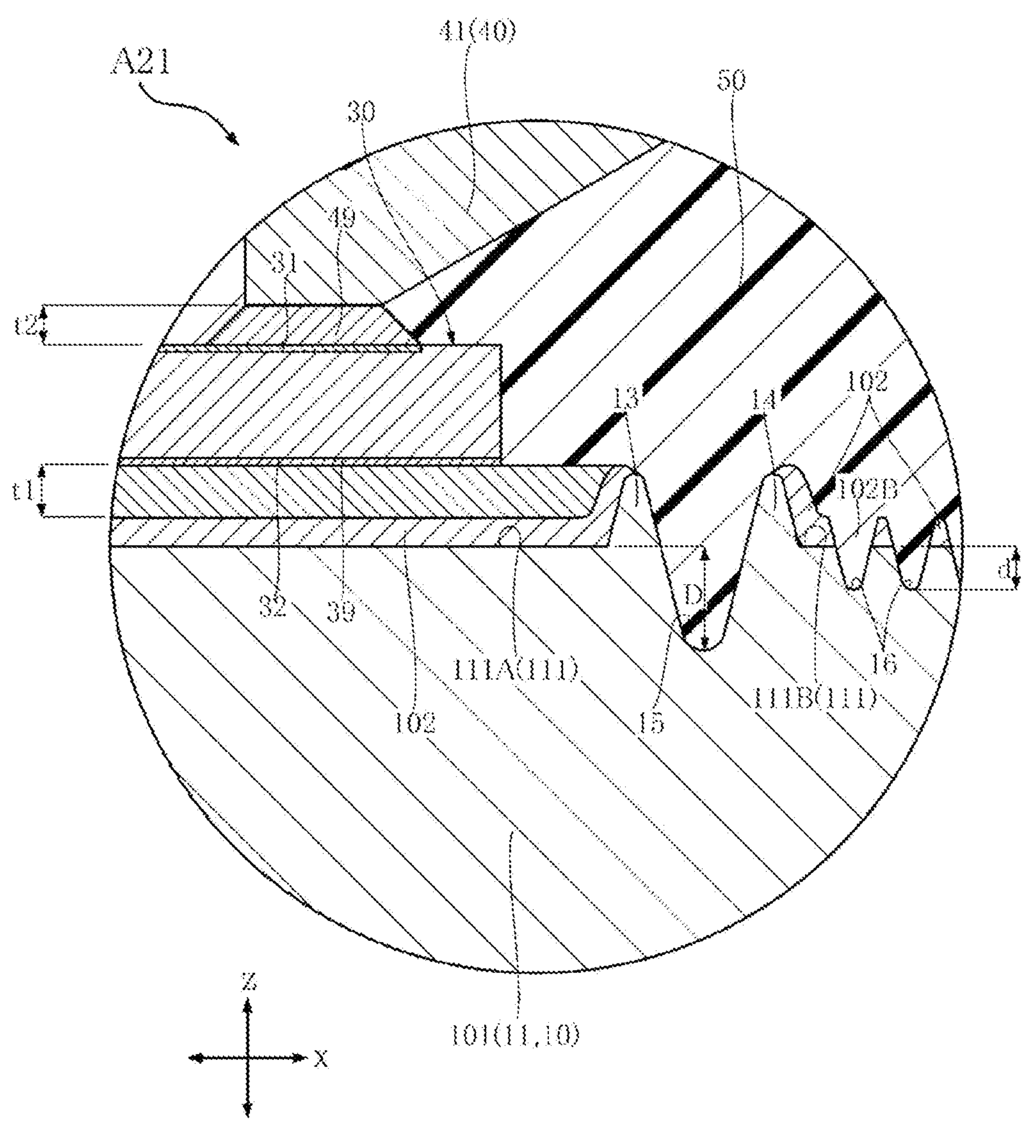
FIG. 17 is a partially enlarged cross-sectional view of a pad portion of a support member and its vicinity according to a modification of the semiconductor device shown in FIG. 12.

Next, a semiconductor device A21, which is a modification of the semiconductor device A20, will be described with reference to FIG. 17. Here, the position of FIG. 17 is the same as the position of FIG. 15.

The semiconductor device A21 is different from the semiconductor device A20 in the configuration of the first metal layer 102 of the pad portion 11 of the support member 10. The first metal layer 102 is in contact with the first region 111A and the second region 111B of the first main surface 111. A plurality of slits 102B leading to the plurality of grooves 16 are formed in the first metal layer 102 overlapping the second region 111B. The sealing resin 50 enters the plurality of grooves 16 via the plurality of slits 102B.

Next, operation and effects of the semiconductor device A20 will be described.

The semiconductor device A20 includes the support member 10 including the main surface (the first main surface 111), the semiconductor element 30 mounted on the main surface, and the bonding layer (the first bonding layer 39) interposed between the support member 10 and the semiconductor element 30. The support member 10 is formed with the first protrusion 13 protruding from the main surface. The first protrusion 13 surrounds the semiconductor element 30 when viewed in the thickness direction z. Therefore, the semiconductor device A20 also makes it possible to suppress excessive wetting and spreading of the bonding layer interposed between the support member 10 and the semiconductor element 30.

The support member 10 includes the base (the first base 101) including the first main surface 111 and the metal layer (the first metal layer 102) laminated on the first main surface 111. The first bonding layer 39 is in contact with the first metal layer 102. As a result, when the semiconductor element 30 is bonded to the support member 10 in the manufacture of the semiconductor device A10, since the wettability of the first bonding layer 39 with respect to the support member 10 is improved, the bonding strength of the semiconductor element 30 with respect to the support member 10 may be increased. In this case, the peripheral edge 102A of the first metal layer 102 may surround the semiconductor element 30 when viewed in the thickness direction z. As a result, the bonding strength of the semiconductor element 30 with respect to the support member 10 may be increased more reliably.

The second region 111B of the first main surface 111 of the support member 10 and the first protrusion 13 formed on the support member 10 surround the first metal layer 102. In the first metal layer 102, the melted first bonding layer 39 is more likely to wet and spread than the first base 101. Therefore, with this configuration, the improvement of the wettability of the first bonding layer 39 with respect to the support member 10 and the suppression of the excessive wetting and spreading of the first bonding layer 39 are compatible.

Further, as the semiconductor device A20 has the same configuration as the semiconductor device A10, the semiconductor device A20 also exerts the operation and effects related to the configuration.

The present disclosure is not limited to the above-described embodiments. The specific configuration of each part of the present disclosure may be freely changed in design.

The technical configurations of the semiconductor device and the method for manufacturing the semiconductor device according to the present disclosure are described below.

[Supplementary Note 1]

A semiconductor device including:

a support member including a main surface facing a thickness direction;

a semiconductor element mounted on the main surface; and a bonding layer interposed between the support member and the semiconductor element, wherein the support member is formed with a first protrusion that protrudes from the main surface, and wherein the first protrusion surrounds the semiconductor element when viewed in the thickness direction.

[Supplementary Note 2]

The semiconductor device of Supplementary Note 1, wherein the bonding layer contains a metal element.

[Supplementary Note 3]

The semiconductor device of Supplementary Note 2, wherein the metal element is tin.

[Supplementary Note 4]

The semiconductor device of Supplementary Note 2 or 3, further including a sealing resin that covers at least a portion of the support member and the semiconductor element, wherein the sealing resin is in contact with the main surface.

[Supplementary Note 5]

The semiconductor device of Supplementary Note 4, wherein the support member includes a back surface facing an opposite side of the main surface in the thickness direction, and wherein the back surface is exposed from the sealing resin.

[Supplementary Note 6]

The semiconductor device of Supplementary Note 4 or 5, wherein the main surface includes a first region that overlaps the semiconductor element when viewed in the thickness direction, and a second region that surrounds the first region, and wherein surface roughness of the second region is greater than surface roughness of the first region.

[Supplementary Note 7]

The semiconductor device of Supplementary Note 6, wherein the support member is formed with a plurality of grooves recessed from the second region and located apart from each other.

[Supplementary Note 8]

The semiconductor device of Supplementary Note 6 or 7, wherein the first protrusion is located between the first region and the second region.

[Supplementary Note 9]

The semiconductor device of Supplementary Note 8, wherein the support member is formed with a second protrusion that protrudes from the main surface and surrounds the first protrusion, and wherein the second protrusion is surrounded by the second region.

[Supplementary Note 10]

The semiconductor device of Supplementary Note 9, wherein the support member is formed with a recess that is recessed from the main surface and surrounds the first protrusion, and wherein the recess is surrounded by the second protrusion.

[Supplementary Note 11]

The semiconductor device of any one of Supplementary Notes 6 to 10, wherein the support member includes a base including the main surface and a metal layer laminated on the main surface, and wherein the bonding layer is in contact with the metal layer.

[Supplementary Note 12]

The semiconductor device of Supplementary Note 11, wherein a peripheral edge of the metal layer surrounds the semiconductor element when viewed in the thickness direction.

[Supplementary Note 13]

The semiconductor device of Supplementary Note 12, wherein the second region surrounds the metal layer.

[Supplementary Note 14]

The semiconductor device of Supplementary Note 13, wherein the first protrusion surrounds the metal layer.

[Supplementary Note 15]

The semiconductor device of any one of Supplementary Notes 4 to 14, further including a terminal located apart from the support member, wherein the semiconductor element includes a first electrode provided on a side which the main surface faces in the thickness direction, and wherein the terminal is electrically connected to the first electrode.

[Supplementary Note 16]

The semiconductor device of Supplementary Note 15, further including a conductive member conductively bonded to the first electrode and the terminal, wherein the conductive member is covered with the sealing resin.

[Supplementary Note 17]

The semiconductor device of Supplementary Note 16, wherein the semiconductor element includes a second electrode provided on an opposite side of the first electrode in the thickness direction, and wherein the second electrode is conductively bonded to the support member via the bonding layer.

According to the present disclosure in some embodiments, it is possible to suppress excessive wetting and spreading of a bonding layer interposed between a support member and a semiconductor element.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A semiconductor device comprising:

a support member including a main surface facing a thickness direction;

a semiconductor element mounted on the main surface;

a bonding layer interposed between the support member and the semiconductor element; and a sealing resin that covers at least a portion of the support member and the semiconductor element, wherein the support member is formed with a first protrusion that protrudes from the main surface, wherein the first protrusion surrounds the semiconductor element when viewed in the thickness direction, wherein the sealing resin is in contact with the main surface, wherein the main surface includes a first region that overlaps the semiconductor element when viewed in the thickness direction, and a second region that surrounds the first region, and wherein surface roughness of the second region is greater than surface roughness of the first region.

2. The semiconductor device of claim 1, wherein the bonding layer contains a metal element.

3. The semiconductor device of claim 2, wherein the metal element is tin.

4. The semiconductor device of claim 1, wherein the support member includes a back surface facing an opposite side of the main surface in the thickness direction, and wherein the back surface is exposed from the sealing resin.

5. The semiconductor device of claim 1, wherein the support member is formed with a plurality of grooves recessed from the second region and located apart from each other.

6. The semiconductor device of claim 1, wherein the first protrusion is located between the first region and the second region.

7. The semiconductor device of claim 6, wherein the support member is formed with a second protrusion that protrudes from the main surface and surrounds the first protrusion, and wherein the second protrusion is surrounded by the second region.

8. The semiconductor device of claim 7, wherein the support member is formed with a recess that is recessed from the main surface and surrounds the first protrusion, and wherein the recess is surrounded by the second protrusion.

9. The semiconductor device of claim 1, wherein the support member includes a base including the main surface and a metal layer laminated on the main surface, and wherein the bonding layer is in contact with the metal layer.

10. The semiconductor device of claim 9, wherein a peripheral edge of the metal layer surrounds the semiconductor element when viewed in the thickness direction.

11. The semiconductor device of claim 10, wherein the second region surrounds the metal layer.

12. The semiconductor device of claim 11, wherein the first protrusion surrounds the metal layer.

13. The semiconductor device of claim 1, further comprising a terminal located apart from the support member, wherein the semiconductor element includes a first electrode provided on a side which the main surface faces in the thickness direction, and wherein the terminal is electrically connected to the first electrode.

14. The semiconductor device of claim 13, further comprising a conductive member conductively bonded to the first electrode and the terminal, wherein the conductive member is covered with the sealing resin.

15. The semiconductor device of claim 14, wherein the semiconductor element includes a second electrode provided on an opposite side of the first electrode in the thickness direction, and wherein the second electrode is conductively bonded to the support member via the bonding layer.

* * * * *